United States Patent [19]
Irikawa et al.

[11] Patent Number: 5,214,662
[45] Date of Patent: May 25, 1993

[54] SEMICONDUCTOR OPTICAL DEVICES WITH PN CURRENT BLOCKING LAYERS OF WIDE-BAND GAP MATERIALS

[75] Inventors: Michinori Irikawa, Yokohama; Masayuki Iwase, Tokyo, both of Japan

[73] Assignee: Furukawa Electric Co., Ltd., Tokyo, Japan

[21] Appl. No.: 791,767

[22] Filed: Nov. 15, 1991

[30] Foreign Application Priority Data
Nov. 16, 1990 [JP] Japan .................................. 2-311119
Nov. 28, 1990 [JP] Japan .................................. 2-326481

[51] Int. Cl.⁵ .............................................. H01S 3/19
[52] U.S. Cl. .................................... 372/46; 372/45; 257/12; 257/13; 257/79
[58] Field of Search ................. 372/45, 46; 357/17; 257/79, 12, 13

[56] References Cited

U.S. PATENT DOCUMENTS

| | | |
|---|---|---|
| 4,425,650 | 1/1984 | Mito et al. ............................ 372/46 |
| 4,692,206 | 9/1987 | Kaneiwa et al. ...................... 372/46 |
| 4,701,927 | 10/1987 | Naka et al. ........................... 372/46 |

Primary Examiner—Georgia Y. Epps
Attorney, Agent, or Firm—Jacobson, Price, Holman & Stern

[57] ABSTRACT

A semiconductor optical device comprising a mesa shaped double heterostructure having an active layer on an InP substrate, and pn junction current blocking layers embedded at all sides of the said double heterostructure, wherein at least portion of said current blocking layers consists of a semiconductor layer lattice-matched to InP and having a band gap larger than that of the InP at a room temperature. Therefore, the current blocking characteristics of the current blocking layer is improved so that the increase of leakage current under operating condition of high temperature and high output power is well suppressed, and the nonlinearity in the optical output-current characteristic is drastically reduced even under such operating conditions.

12 Claims, 5 Drawing Sheets

SEMICONDUCTOR OPTICAL DEVICES WITH PN CURRENT BLOCKING LAYERS OF WIDE-BAND GAP MATERIALS

BACKGROUND OF THE INVENTION

1. Field of the Invention

This invention relates to current injection type semiconductor optical devices with improved leakage current characteristics.

2. Description of the Prior Art

A current injection type semiconductor optical devices such as, for example, a semiconductor laser diode which can lase at a low threshold current in fundamental lateral mode, a semiconductor laser optical amplifier have current blocking layers embedded at both sides of a mesa stripe including an active layer (a light emitting region) to inject and constrict current in the active layer.

As such a current blocking layer, a structure including a pn junction is generally employed.

FIG. 6 shows a known semiconductor laser diode manufactured through processes including a liquid-phase epitaxial method (LPE method).

In the case of the semiconductor laser diode shown in FIG. 6, an n-InP clad layer 2, a GaInAsP active layer 3, p-InP clad layers 4a, 4b, a p-InP current blocking layer 6, an n-InP current confining layer 7, and a GaInAsP cap layer 5 are formed on a predetermined portion of an n-InP substrate 1, and an n-electrode 8 is formed on the lower surface of the substrate 1, and a p-electrode 9 is provided on the upper surface of the cap layer 5.

In the diode structure of FIG. 6, the pn junction comprising the p-InP current blocking layer and the n-InP clad layer 2 is forward biased similarly to the pn double heterojunction including active layer 3 under lasing conditions, and the p-InP clad layer 4b, the n-InP current confining layer 7, the p-InP current blocking layer and the n-Inp clad layer 2 constitute a pnpn (InP) thyristor structure 10 as indicated by broken lines in FIG. 6.

In the case of the semiconductor laser diode manufactured as described above, as shown in FIG. 4, most current is injected into the region of the active layer 3 due to the difference of built-in potentials i.e. forward bias voltages required for current rising up, but a leakage current through the pass I to II in FIG. 6 is also generated to become a gate current of the thyristor structure 10, as the pn junction comprising the current blocking layer 6 and clad layer 2 is also forward biased as described above. Therefore, an anode current of the thyristor structure 10 also flows as a leakage current through the pass III to IV in FIG. 6.

FIG. 7 shows a semiconductor laser diode by an MOCVD method.

In the case of the semiconductor laser diode in FIG. 7, the diode has the same arrangement as the semiconductor laser diode of FIG. 6, and a p-InP clad layer 4b, an n-InP layer 7, a p-InP layer 6, and an n-InP clad layer 2 are formed in a pnpn (InP) thyristor structure 10.

In the step of forming a current blocking layer in the semiconductor laser diode of FIG. 7, when the p-InP layer 6 (the current blocking layer) is grown by an MOCVD method, the initial layer of the p-InP layer 6 is so grown as to rise along the side surface of a mesa stripe as its peculiar phenomenon of this method, and the contacting area of the p-InP clad layer 6 and the p-InP layer 6 is generated.

The larger the contacting area of both the layers 4a and 6 is larger, the larger the leakage current which flows in a direction from I to an arrow II in FIG. 7 flow. In addition, since this corresponds to the gate current of the thyristor structure 10, the anode current of the thyristor structure 10 becomes larger, and current blocking characteristic is more deteriorated.

As a present remedy, the p-InP clad layer 4a is reduced in thickness as the contacting area is proportional to the thickness of the p-InP clad layer 4a and the p-InP layer 6 is increased in resistance thereby enhancing the current blocking characteristic of the semiconductor laser diode prepared by the MOCVD method in the same degree as that of semiconductor laser diode by the LPE method.

In addition, when mainly by an MOCVD is employed as a manufacturing method, a semiconductor laser diode shown in FIG. 8 can be also manufactured.

In the semiconductor laser diode of FIG. 8, a p-InP clad layer 12, a GaInAsP active layer 13, n-InP clad layer 14a, 14b, an n-GaInAsP cap layer 15, an n-InP current confining layer 16, a p-InP current blocking layer 17 are formed on a p-InP substrate 11, a p-electrode 9 is formed on the lower surface of the substrate 11, and an n-electrode 8 is formed on the upper surface of the cap layer 15.

Problems to be Solved

In the case of the above-described semiconductor laser diode, the following items must be solved as technical subjects.

As the first subject, a leakage current flows through a forward biased current blocking layer in a direction from I to an arrow II of FIGS. 6 to 8.

As the second subject, as shown in FIGS. 6 and 7, the current blocking and confining layers constitute the pnpn (InP) type thyristor structure 10.

In the case of the thyristor structure 10, the leakage current flowing through the pass I to II corresponds to the gate current of the thyristor. Therefore the increase in the leakage current readily increases the anode current of the thyristor, in some cases to break over, the thyristor, thereby becoming a conducting state.

In this manner, the leakage current flowing through the pass I to II and the anode current of the thyristor structure 10 through the pass III–IV cause the nonlinearity of "optical output-current characteristic" of the semiconductor laser diode and generate a large leakage current at the time of its operation at a high temperature and high output power.

Therefore, in the case of the semiconductor laser diode having the thyristor structure, operations at high output power or at high temperature are difficult due to such disadvantages.

As the third subject, it is difficult to form a preferably current blocking layer for double heterostructure on a p-type substrate by a vapor-phase epitaxial method such as an MOCVD method. For example, in the semiconductor laser diode exemplified in FIG. 8, when the n-InP layer 16 (current confining layer) is formed by the MOCVD method, the n-InP layer 16 is brought into contact with the side surface of the n-InP clad layer 14a as described above.

Since this n-InP layer 16 has a smaller resistance than the p-InP layer 6 (the current confining layer) in the case of the n-type substrate, a leakage current tends to flow easily, and a sufficient current blocking characteristic cannot be obtained with the same method as the n-type substrate.

SUMMARY OF THE INVENTION

An object of the present invention is to provide a semiconductor optical devices which can eliminate the above-described technical problems of leakage current in the conventional semiconductor laser diode, and which can realize excellent current blocking characteristics by employing wide band gap material as at least one of the pn current blocking layers.

In order to achieve the above-described and other objects of the present invention, there is provided a semiconductor optical devices comprising a mesa shaped double hetero structure including an-active layer and pn junction current blocking and confining layers buried at all sides of said mesa shaped double hetero structure, wherein at least portion of each of said current and confining layers consists of a semiconductor layer lattice-matched to InP and having a band gap larger than that of the InP at a room temperature.

In the semiconductor optical devices as described above, when InP substrate is n-type, the current blocking and confining layers including p-type, n-type layers grown in that order from substrate side are formed at all sides of the said double hetero structure, wherein at least said p-type current blocking layer consists of a semiconductor layer having larger band gap than InP at room temperature.

In the semiconductor optical devices described above, when InP substrate is p-type, the current blocking and confining layers including p-type, n-type, p-type layers grown in that order from substrate side are formed at sides of the said double hetero structure, wherein at least a portion of said current blocking layers consists of a semiconductor layer having larger band gap than InP at room temperature.

In the semiconductor optical devices as described above, the semiconductor layers constitute the portion or all of the current blocking layer consist, for example, of an $Al_x In_{1-x} As$ (x=0.48) or $AlAs_y Sb_{1-y}$ (y=0.56).

In the semiconductor optical devices as described above, the current blocking layers may be formed by a liquid-phase epitaxial method or a vapor-phase epitaxial method.

Further the mesa including the double heterostructure of the semiconductor optical devices may be formed in a stripe or a cylindrical shape.

In the case of the semiconductor optical devices having such semiconductor layers, a semiconductor laser diode, a semiconductor laser optical amplifier, or a surface light emitting type semiconductor diode may be exemplified.

The result of analyses on the operation characteristics of the pnpn thyristor will be first described as the main portion of the subject.

FIG. 5(a) shows cross sectional structure of the above-described pnpn type thyristor comprising p-type InP clad layer 4b, the n-type InP layer 7, the p-type InP layer 6 and the n-InP clad layer 2, and the equivalent circuit model of 3-terminal thyristor comprising two transistors $Tr_1$, $Tr_2$, avalanche multiplication factor $M_p$, $M_n$ at the junction $J_2$, an anode A, a cathode C and a gate G.

FIG. 5(b) shows "current-voltage characteristics" when a forward bias voltage is applied to the anode A in the thyristor of FIG. 5(a).

The features of characteristics for the pnpn type thyristor shown in FIGS. 5(a) and 5(b) are as follows.

It exhibits transition to a conducting state having an extremely low resistance by a forward bias greater than a breakover voltage $V_{BO}$.

The larger the gate current is, the easier it breaks over, and the greater anode current it exhibits.

In the case of the pnpn type thyristor shown in FIGS. 5(a) and 5(b), most of the anode voltage is applied as a reverse bias to a junction $J_2$.

In this case, from the equivalent circuit shown in FIG. 5(a), one can obtain following equation (1), as an expression for the anode current $I_A$ until the thyristor breaks over.

$$I_A = [I_o + (\alpha_2 \cdot M_n \cdot I_g)] / [1 - (\alpha_1 \cdot M_p + \alpha_2 \cdot M_n)] \quad (1)$$

where
$I_o$: a leakage current of the junction $J_2$
$I_g$: gate current
$\alpha_1$: common-base current gain of transistor $Tr_1$
$\alpha_2$: common-base current gain of transistor $Tr_2$
$M_n$: avalanche amplification factor for electrons in a depletion layer of junction $J_2$
$M_p$: avalanche amplification factor for holes in a depletion layer of junction $J_2$ As seen from the equation (1), the break-over conditions of the thyristor are represented by the following equation (2).

$$\alpha_1 \cdot M_p + \alpha_2 \cdot M_n = 1 \quad (2)$$

$\alpha_1$ and $\alpha_2$ of the equation (2) are drastically increased normally when the anode current $I_A$ increases or the temperature of the diode rises.

Further, the $M_n$ and $M_p$ generally have dependency represented by the following equation (3). In the equation (3), in the case of $V << V_a$, $M = 1$ is satisfied, but as the V approaches the $V_a$, the M is drastically increased.

$$M = 1 / [1 - (V/V_a)^n] \quad (3)$$

Because of such behaviors of the $\alpha$ and the M together with the relationship of the equation (1), increases in the gate current and the applied voltage, and temperature rise cause to increase the anode current of the thyristor. Further, since a positive feedback system of increasing the $\alpha_1$ and $\alpha_2$ due to the increase in the anode current is formed, the thyristor feasibly breaks over.

Therefore, in order to suppress the breakover of the thyristor as observed in the semiconductor optical devices and to reduce the leakage current, it is effective to reduce the above-described $I_o$, $I_g$, $\alpha_1$, $\alpha_2$, $M_n$ and $M_p$.

In the case of the present invention, in the semiconductor optical devices in which the reverse biased pn junction current blocking and confining layers are buried at both sides of the double heterostructure having the active layer, the portion of the current blocking and confining layer consists of the semiconductor layer lattice-matched to the InP and having a larger band gap than that of the InP.

The semiconductor optical devices having the features as described above are excellent at the following points as will be understood from the embodiments which will be described later.

One of them resides in that the leakage current $I_g$ is reduced and hence the anode current $I_A$ of the parasitic thyristor can be reduced.

The other resides in that at least one of the transistor constituting the thyristor is a hetero bipolar type with wide band gap layer as a base since the band gap of the semiconductor layer constituting at least the portion of the current blocking and confining layers is larger than that of the InP at a room temperature.

Therefore, the $\alpha_2$ is reduced in the same principle as the hetero bipolar transistor but under the reverse effect, the anode current of the thyristor is hence reduced, and further the breakover of the thyristor can be suppressed.

BRIEF DESCRIPTION OF THE DRAWINGS

The above and other objects as well as advantageous features of the invention will become apparent from the following detailed description of the preferred embodiments taken in conjunction with the accompanying drawings.

DESCRIPTION OF THE PREFERRED EMBODIMENTS

Embodiments of a semiconductor optical devices according to the present invention will now be described with reference to the accompanying drawings.

FIGS. 1(a) to 1(d) show an embodiment of a semiconductor laser diode according to the present invention to be manufactured using an LPE (Liquid-Phase Epitaxial) method.

Figure 1:
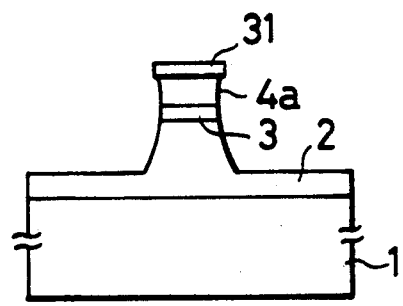
FIGS. 1(a) to 1(d) are sectional views exemplifying an embodiment of a semiconductor laser diode according to the present invention manufactured using an LPE method is the case of an n-type substrate together with manufacturing steps.
Figure 1:
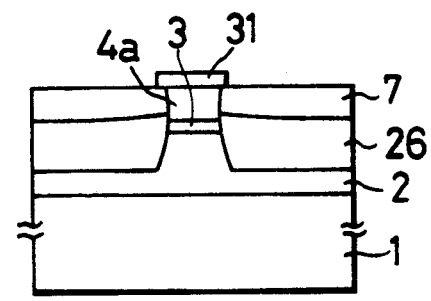
Figure 1:
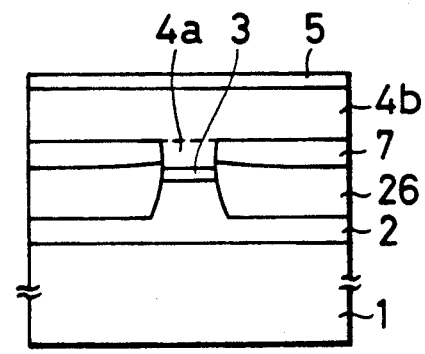

In the steps of FIG. 1(a), an n-InP clad layer 2, a non-doped GaInAsP active layer 3, and a p-InP clad layer 4a are at first sequentially grown on an n-InP substrate 1, an etching mask 31 made of an SiO$_2$ is formed in a stripe shape on the p-InP clad layer 4a, and the layers 2, 3, and 4a are then formed in mesa stripes on the n-InP substrate 1 through suitable etching means such as a dry etching method, a wet etching method, etc.

In the steps of FIG. 1(b), in order to form a current blocking and confining layers comprising p-type semiconductor layer and an n-type semiconductor layer, a p-Al$_x$In$_{1-x}$As (x=0.48) layer 26 and an n-InP layer 7 are formed on the etched region by selective burying growth technology.

In the steps of FIG. 1(c), after the etching mask 31 is removed, the p-InP clad layer 4b is grown on the surfaces of the clad layer 4a and the n-InP layer 7 and further p-GaInAsP cap layer 5 is grown thereon.

Figure 1D:
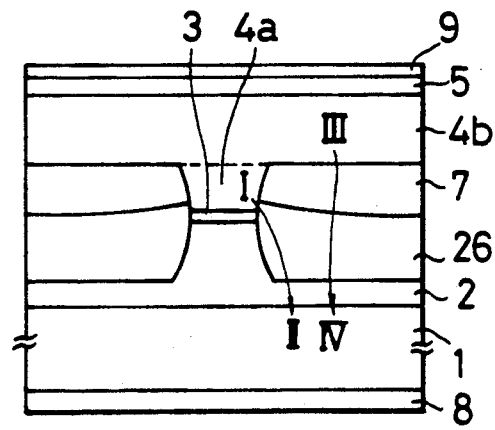

In the steps of FIG. 1(d), an n-type electrode 8 is formed on the lower surface of the substrate 1, and a p-type electrode 9 is provided on the upper surface of the cap layer 5.

First, the semiconductor laser diode having the structure shown in FIG. 1(d) will be described in terms of a leakage current in a direction from I to an arrow II in FIG. 1(d) to become a gate current of the thyristor.

When a current is injected into the semiconductor laser diode shown in FIG. 1(d) up to a lasing state, the pn heterojunction of the active layer 3 is forward biased about 1.0 V, and two layer 26 and 2 in the passage from I to arrow II of FIG. 1(d) are also forward biased with the voltage of almost same degree.

Now, the current flowing through the pn junction consisting of layers 26 and 2 when it is forward biased at about 1.0 V as above can be regarded as mostly being a diffusion current, and the current-voltage characteristic of this case is represented by the following equation (4).

$$J_D = [(K_n/N_p)\cdot\exp(-E_{gp}/kT) + (K_p/N_n)\cdot\exp(-E_{gn}/kT)]\cdot\exp(-qV_j/kT) \quad (4)$$

where, $J_D$ is a current density, the first term corresponds to the diffusion current $J_n$ of electrons, and the second term corresponds to the diffusion current $J_p$ of holes. In the equation (4), the definitions of each symbol are as follows.

Kn: constant determined according to material and doping conditions of n-type semiconductor
Kp: constant determined according to material and doping conditions of p-type semiconductor
Egp: band gap of p-type semiconductor
Egn: band gap of n-type semiconductor
Np: doping concentration of p-type semiconductor
Nn: doping concentration of n-type semiconductor
k: Boltzmann's constant
T: temperature in Kelvin
q: charge of electrons
Vj: applied voltage In the equation (4), in view of the magnitudes of the electron current (Jn) and the hole current (Jp), if the dopings to the p-type and to the n-type are in the same degree Jn is much larger than Jp and Jn is about 90% of total current due to the difference of the mobilities and effective masses of electrons and holes.

Now let us take notice of the exponential term of electron current in equation (4). When the above-described current blocking layer 26 is formed of p-InP, the exponential term becomes as the following equation (5), while, when the current blocking layer 26 is formed of p-AlInAs, the exponential term becomes as the following equation (6).

$$exp\{-(Egp-V_j)/kT\} = exp\{-(1.35-1.1)/0.026\} = 6.7 \times 10^{-5} \quad (5)$$

$$exp\{-(Egp-V_j)/kT\} = exp\{-(1.42-1.1)10.026\} = 4.5 \times 10^{-6} \quad (6)$$

Thus, when the current blocking layer 26 is formed of AlInAs, the diffusion current corresponding to the electron current in the equation (4) is reduced to about 1/15.

Therefore, when the current blocking layer 26 of the semiconductor laserdiode with the structure as shown in FIG. 1(d) is formed of a p-AlInAs, a leakage current (corresponds to a gate current) flowing through the passage I to an arrow II in FIG. 1(d) can be reduced to about 1/6 (=0.1×1/15+0.1=0.16) in comparison with that for the p-InP current blocking layer. Further, as the gate current is reduced in this manner, an anode current of the thyristor is also drastically reduced as understood from the equation (1).

Next in the diode structure of FIG. 1(d), the (anode current) flows through the thyristor in the direction from III to an arrow IV will be discussed.

In the diode structure shown in FIG. 1(d), the npn transistor in the thyristor becomes a heterobipolar transistor with wide band gap base. Therefore, the common-base current gain $\alpha_2$ is reduced resulting in reduced anode current of the thyristor and a breakover of the thyristor scarcely occurs, as is understood from eq. (1).

The reason is as follows.

In the case of the heterojunction bipolar transistor in the diode structure in according to the present invention, since the current gain $\alpha_2$ is common base current gain, it can be represented by the following equations (7) to (9).

$$\alpha_2 = \gamma \alpha_T \quad (7)$$

$$\gamma = \left\{ 1 + \left[ \frac{(N_c \cdot N_v)_E}{(N_c \cdot N_v)_B} \cdot \frac{N_B \cdot D_E \cdot L_B}{N_E \cdot D_B \cdot L_E} \right] \cdot \tanh(W_B/L_B) \cdot \exp\left(-\frac{E_{gE}-E_{gB}}{kT}\right) \right\}^{-1} \quad (8)$$

$$\alpha_T = \frac{1}{\cosh(W_B/L_B)} \quad (9)$$

where $\gamma$ and $\alpha_T$ represent emitter efficiency and base transport factor respectively, the subscript E, B denote emitter and base respectively. The definitions of each symbol in above equations (7), (8) and (9) are as follows:

$N_C$: effective density of state for conduction band
$N_V$: effective density of state for valance band
$N_E$: doping concentration of emitter
$N_B$: doping concentration of base
D: diffusion constant of minority carrier
L: diffusion length of minority carrier
$W_B$: base length
$E_g$: band gap In the conventional heterojunction bipolar transistor, the effect is utilized that $\gamma = 1$ is realized without depending upon the doping conditions, since condition $E_{gE} - E_{gB} > KT$ is satisfied and hence the exponential term in eq. (8) can be sufficiently reduced.

On the contrary, in the case of the heterobipolar transistor according to the present invention, the reverse effect is utilized that $\gamma$ is reduced sufficiently because condition $E_{gE} - E_{gB} < -kt$ is satisfied and hence the exponential term in the equation (8) is sufficiently increased by using the p-AlInAs burying layer (as the base) layer.

The amount in [] in the equation (8) is regarded as being not so different between that of the case using the AlInAs and that of the case using the InP as the current blocking layer.

In this case, it is assumed that [] is 0.2 and $W_B/L_B = 0.5$ is satisfied for the both cases of current blocking InP layer and the current blocking AlInAs layer.

In this assumption, in the case of the InP current blocking layer, since the exponential term of the equation (8) is "1", $\gamma = 0.92$, $\alpha_2 = 0.82$ are obtained, but in the case of the AlInAs current blocking layer, $E_{gE} - E_{gB} = 1.35 - 1.42 = 0.07$ eV is obtained, and hence $\gamma = 0.42$, $\alpha_2 = 0.37$ are obtained.

Thus, the common-base current gain $\alpha_2$ of the transistor according to the present invention is reduced to about ½ as compared with that of the conventional case.

Therefore, in the case of the diode according to the present invention, the leakage current $I_g$ in the direction from I to the arrow II which is the gate current of the thyristor is reduced to about 1/6, and the common-base gain $\alpha_2$ of npn transistor in the thyristor is also reduced to a half.

When the reducing effect of the $I_g$ and the $\alpha_2$ is calculated by the equation (1), it is understood that the value of (anode current $I_a$)/(gate current $I_g$) is reduced from "10" to "1" by about one-tenth.

Therefore, the leakage current can be entirely reduced to 1/(6×10).

Figure 2:
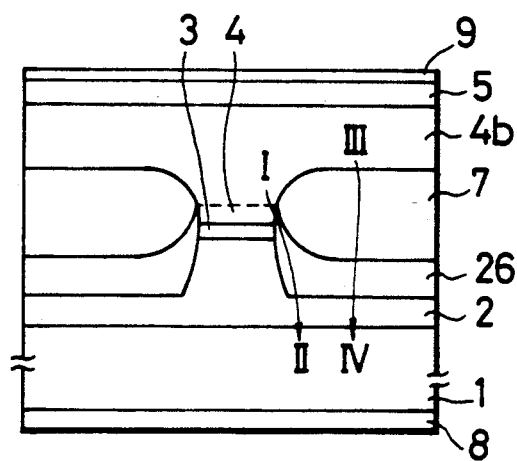
FIG. 2 is a sectional view exemplifying another embodiment of a semiconductor laser diode according to the present invention manufactured using MOCVD method.

FIG. 2 shows a predetermined layer structure formed on an n-InP substrate 1 through processes including an MOCVD method (one type of vapor-phase epitaxial method) as another embodiment of the semiconductor laser diode according to the present invention.

In the case of the another embodiment of the semiconductor photodiode exemplified in FIG. 2, the structure of the diode, the functions of the diode are substantially the same as those of that shown in FIG. 1(d) except the points manufactured mainly by the MOCVD method.

Therefore, even in the case of the semiconductor photodiode exemplified in FIG. 2, the leakage current $I_g$ in the direction from I to an arrow II which is a gate current of the thyristor is reduced to about 1/6, and the common-base current gain $\alpha_2$ of npn transistor in the thyristor is reduced to a half in the same manner as the first embodiment of the present invention as described above.

Figure 3:
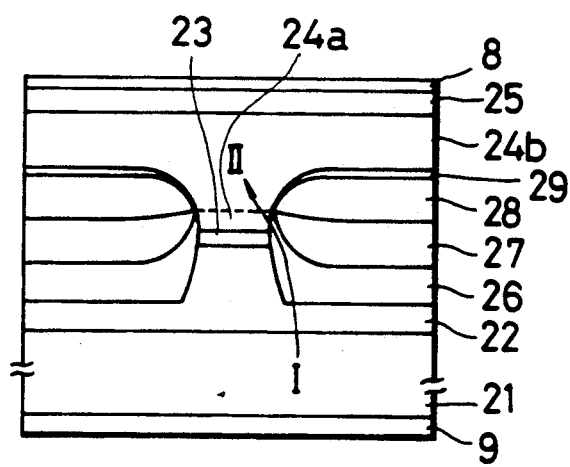
FIG. 3 is a sectional view exemplifying a still another embodiment of a semiconductor photodiode according to the present invention manufactured using MOCVD method in the case of a p-type substrate.
Figure 4:
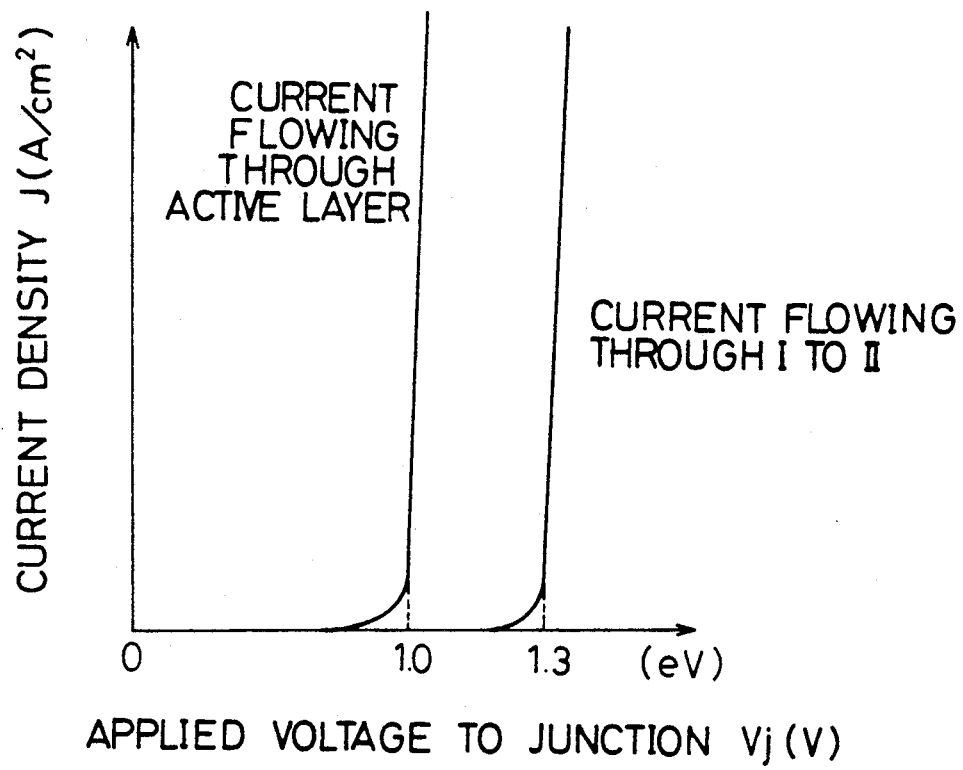
FIG. 4 is an explanatory view showing a current-voltage characteristic in comparison of double pn heterojunction of an active layer and a pn junction in a current passage from I to an arrow II in a semiconductor optical devices shown in FIGS. 6, 7 and 8.
Figure 5:
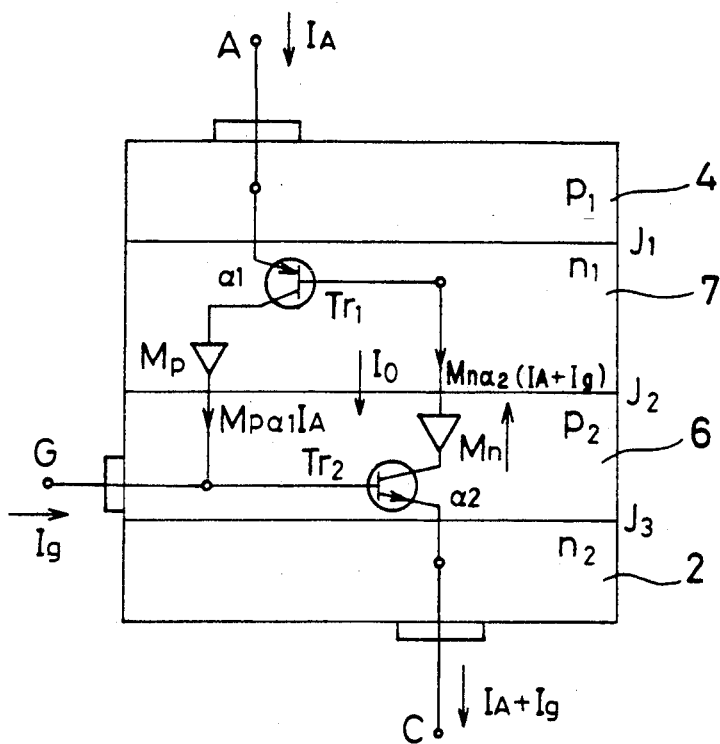
FIG. 5(a) is a 3-terminal thyristor sectional structure and its equivalent circuit diagram.
FIG. 5(b) is a forward current-voltage characteristic diagram of the thyristor shown in FIG. 5(a)
Figure 5:
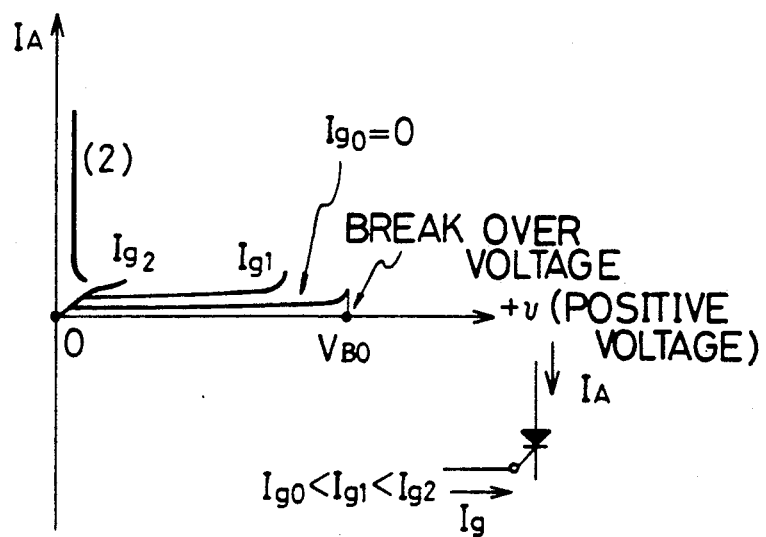
Figure 6:
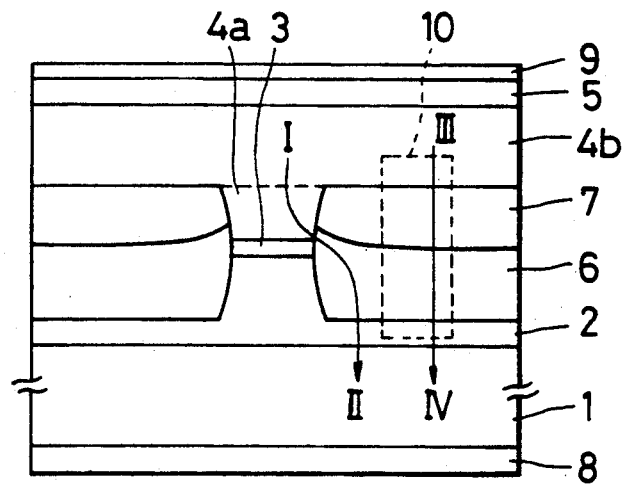
FIG. 6 is a sectional view showing a conventional semiconductor laser diode manufactured using an LPE method in the case of an n-type substrate.
Figure 7:
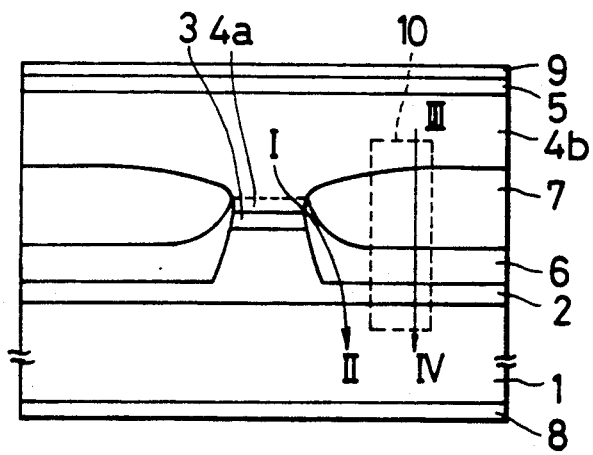
FIG. 7 is a sectional view showing a conventional semiconductor laser diode manufactured using an MOCVD method in the case of an n-type substrate.
Figure 8:
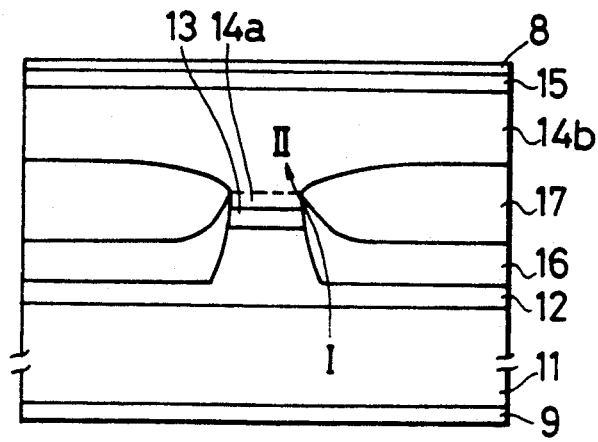
FIG. 8 is a sectional view showing a conventional semiconductor laser diode manufactured using an MOCVD method in the case of a p-type substrate.

FIG. 3 shows a predetermined layer structure formed on a p-InP substrate 21 through processes including an MOCVD method (one type of vapor-phase epitaxial method) as still another embodiment of a semiconductor laser diode according to the present invention.

Thus, in the case of the semiconductor laser diode exemplified in FIG. 3, a p-InP clad layer 22, a nondoped GaInAsP active layer 23, n-InP clad layer 24a, 24b, an n-GaInAsP cap layer 25, a current blocking and confining layer (p-AlInAs layer 26, an n-AlInAs layer 27, a p-AlInAs layer 28, and an n-InP layer 29) are formed on a p-InP substrate 21, a p-type electrode 9 is formed on the lower surface of the substrate 21, and an n-type electrode 8 is formed on the upper surface of the cap layer 25.

When the still another embodiment of the semiconductor laser diode exemplified in FIG. 3 is manufactured, since the vapor-phase epitaxial method is executed on the p-type substrate, the contact between the p-AlInAs layer 26 of a first burying layer and the n-InP clad layer 24a occurs. In this case, since the layer 26 is of a p-type and formed of AlInAs, no problem like in the prior art with the n-InP first burying layer occurs, and a leakage current $I_g$ in the direction from I to an arrow II in FIG. 3 is also reduced to about 1/6.

It should be noted that the leakage current in the direction from I to the arrow II in FIG. 3 does not become a gate current of the thyristor.

Further, the common-base current gain $\alpha_2$ of npn transistor in the thyristor is reduced to a half as described above, since the p-AlInAs layer 28 is formed as a current blocking layer corresponding to the base of said transistor.

When the still another embodiment of the semiconductor laser diode exemplified in FIG. 3 is manufactured, the layers 22, 23 and 24a are first deposited on the p-InP substrate 21, then the layers 22, 23, 24a on the p-InP substrate 21 are formed in mesa stripes through masking and etching processes, thereafter the p-AlInAs layer 26, the n-AlInAs layer 27, the p-AlInAs layer 28 and the n-InP layer 29 are sequentially buried grown selectively on the etched portion, further the mask is removed, and the n-InP clad layer 24b and the n-GaInAsP cap layer 25 is deposited.

The role of the selectively grown n-InP layer 29 is to prevent the pn junction characteristics from deterioration, which is expected if the layer 29 was not formed, due to the oxidation of p-AlInAs layer surface through exposure to the air in regrowth step.

The current blocking and confining layer in the present invention can be formed, as in the embodiments described above, partly of $Al_xIn_{1-x}As$ (x=0.48), or partly or entirely of $AlAs_ySb_{1-y}$ (y=0.56). $Al_yGa_xIn_{1-x-y}As(y>0.4, x+y=0.48)$ lattice matched to InP can also be used as such current blocking and confining layers, where y values should be larger than 0.4 to have larger band gap than that of InP.

When the double heterostructure of the embodiments of semiconductor optical devices according to the present invention is formed in a stripe shape, it is adapted for a semiconductor laser diode, a semiconductor laser optical amplifier, while when the double heterostructure is cylindrical, it is adapted for a surface emitting type semiconductor optical device.

In addition, the active later of the embodiments of the semiconductor optical devices according to the present invention is formed, in addition to the GaInAs(P) layer, a multiple quantum well structure including the GaInAs(P) layer together with an SCH structure and/or GRIN-SCH structure.

Such structures may be manufactured by, in addition to an LPE method, an MOCVD method, a VPE method, a CBE method, etc.

Effects of the Invention

According to the embodiments of the semiconductor optical device of the present invention as described above, at least portions of the pn junction current blocking and confining layers grown at both sides of the double heterostructure are lattice-matched to the InP and have the band gap larger than that of the InP at room temperature. Therefore, the current blocking and confining characteristics is improved so that the increase of leakage current under operating condition of high temperature and high output power is well suppressed, and the nonlinearity in the optical output-current characteristic is drastically reduced even under such operating conditions. Hence, such optical device can realize excellent temperature characteristics and high-power operation at high temperature.

What is claimed is:

1. A semiconductor optical device including a mesa, current blocking and confining layers embedded at all sides of said mesa and a pair of ohmic contact metals, a base semiconductor region of said mesa being an InP layer of a first conductivity type, said mesa including a double-heterostructure comprising an active layer including (Al)GaInAs(P) and a pair of cladding layers consisting of both p and n conductivity type layer, wherein materials of said cladding layers include either InP or $(AlGa)_xIn_{1-x}As(x=0.48)$, and said current blocking and confining layers includes a pn junction, and wherein at least a portion of said current blocking and confining layers consists of either $(Al_yGa_xIn_{1-x-y}As(y>0.4, x+y=0.48)$ or $AlAs_ySb_{1-y}(Y=0.56)$, in either case of a second conductivity type.

2. A semiconductor optical device according to claim 1, wherein said Inp layer is n-type and is formed on an n-InP substrate.

3. A semiconductor optical device according to claim 1, wherein said current blocking layer is formed by a liquid-phase epitaxial method.

4. A semiconductor optical device according to claim 1, wherein said current blocking layer is formed by a vapor-phase epitaxial method.

5. A semiconductor optical device according to claim 1, wherein said double heterostructure is formed in a striped mesa shape.

6. A semiconductor optical device according to claim 1, wherein said double heterostructure is formed in a cylindrical mesa shape.

7. A semiconductor optical device including a mesa, current blocking and confining layers embedded at all sides of said mesa and a pair of ohmic contact metals, a base semiconductor region of said mesa being an InP layer of p-type conductivity, and said mesa including a double-heterostructure comprising an active layer including (Al)GaInAs(P) and a pair of cladding layers consisting of both p and n conductivity type layer, wherein materials of said cladding layers include either InP or $(AlGa)_xIn_{1-x}As(x=0.48)$, and where said current blocking and confining layers comprise four layers consisting of a first p-type layer, a first n-type layer, a second p-type layer and a second n-type layer, respectively, which are embedded in that order from said base semiconductor layer side to the top layer, except at said mesa region, wherein at least a portion of the first p-type, first n-type and second p-type layers of said current blocking and confining layers, consists of either $(Al_yGa_xIn_{1-x-y}As(y>0.4, x+y=0.48)$ or $AlAs_ySb_{1-y}(Y=0.56)$ and the second n-type layer of said current blocking and confining layers consists of InP.

8. A semiconductor optical device according to claim 7, wherein said InP layer is p-type and is formed on an n-InP substrate.

9. A semiconductor optical device according to claim 7, wherein said current blocking layer is formed by a liquid-phase epitaxial method.

10. A semiconductor optical device according to claim 7, wherein said current blocking layer is formed by a vapor-phase epitaxial method.

11. A semiconductor optical device according to claim 7, wherein said double heterostructure is formed in a striped mesa shape.

12. A semiconductor optical device according to claim 7, wherein said double heterostructure is formed in a cylindrical mesa shape.

* * * * *